United States Patent [19]

Schott, Jr. et al.

[11] 4,013,262

[45] Mar. 22, 1977

[54] ROTARY APPARATUS FOR MOVING WORKPIECES THROUGH TREATMENT BEAM WITH CONTROLLED ANGLE OF ORIENTATION AND ION IMPLANTER INCORPORATING SUCH APPARATUS

[75] Inventors: Charles M. Schott, Jr., Gloucester; Geoffrey Ryding, Manchester, both of Mass.

[73] Assignee: Varian Associates, Palo Alto, Calif.

[22] Filed: Dec. 13, 1974

[21] Appl. No.: 532,383

[52] U.S. Cl. .......................... 250/492 A; 250/442; 250/451

[51] Int. Cl.² ........................................ H01J 37/00

[58] Field of Search ............. 250/492 A, 492, 440, 250/442, 309, 451, 456.

[56] References Cited

UNITED STATES PATENTS

| | | | |
|---|---|---|---|
| 3,240,934 | 3/1966 | Watanabe et al. | 250/442 |
| 3,446,960 | 5/1969 | Sciacca et al. | 250/442 |
| 3,628,013 | 12/1971 | Heide | 250/442 |
| 3,643,091 | 2/1972 | Lucas | 250/442 |
| 3,689,766 | 9/1972 | Freeman | 250/492 A |
| 3,702,397 | 11/1972 | Lucas | 250/442 |
| 3,778,621 | 12/1973 | Mikajiri | 250/442 |
| 3,778,626 | 12/1973 | Robertson | 250/492 A |

OTHER PUBLICATIONS

"Ion Beams", Wilson & Brewer Wiley–Interscience Publications, 1973, pp. 457–458.

Primary Examiner—Alfred E. Smith
Assistant Examiner—B. C. Anderson

[57] ABSTRACT

An apparatus for distributing a beam substantially uniformly over a workpiece comprising a workpiece holder, first means for rotating the holder in a generally circular path about a first axis which is generally perpendicular to the axis of the beam, second means for counter-rotating the holder about a second axis parallel to the first axis at a rate dependent upon the rate of rotation of the holder about the first axis to provide, in cooperation with the first means, a constant orientation of the holder relative to the beam, and third means for producing relative motion between the workpiece and the beam in a direction parallel to the first axis.

21 Claims, 8 Drawing Figures

ROTARY APPARATUS FOR MOVING WORKPIECES THROUGH TREATMENT BEAM WITH CONTROLLED ANGLE OF ORIENTATION AND ION IMPLANTER INCORPORATING SUCH APPARATUS

This invention relates to a mechanical scanner system for distributing a beam over discrete workpieces. It is particularly applicable to the manufacture of semiconductor devices by the ion implantation technique.

As is well known, it is necessary in the ion implantation technique of semi-conductor manufacture to distribute the implanted ions uniformly over the substrate (e.g., a silicone wafer). This uniformity of beam exposure has been approached in various ways. The beam itself may be scanned over a stationary substrate (beam scanning) or the substrate may be moved through the beam (mechanical scanning), or a combination of these two may be used. Beam scanners were developed in an effort to increase production rate and improve implantation uniformity over that offered by known practical mechanical scanners. At very high beam intensities, however, it becomes extremely difficult to provide deflection fields which are sufficiently well controlled to permit use of the beam scanning technique. Additionally, mechanical scanning can circumvent the problem of substrate overheating with intense beams since each substrate can be moved into and out of the beam many times during its exposure.

In view of the foregoing, it is a principal object of the present invention to provide improved mechanical scanning apparatus for exposing workpieces (e.g., semiconductor substrates) to treatment beams in a highly uniform manner. In particular, it is an object of the invention to provide an improved system for use with high intensity beams, the scanner system providing high uniformity of ion implantation.

In one aspect of the present invention there is featured an apparatus for distributing a beam, preferably an ion beam, over a workpiece comprising a workpiece holder, first means for rotating the holder in a generally circular path about a first axis, second means for counter-rotating the holder about a second axis parallel to the first axis at a rate dependent upon the rate of rotation of the holder about the first axis to provide, in cooperation with the first means, a constant orientation of the holder relative to the beam, and third means for producing relative motion between the workpiece and the beam in a direction parallel to the first axis. In preferred embodiments the relative motion between the workpiece and the beam is produced by a drive system for driving the workpiece holder in a reciprocating fashion parallel to the first axis. In a preferred embodiment the holder is driven in its generally circular path by a rotatable drive shaft which is connected to the holder by means of a drive arm to the end of which the holder is pivoted. The means for counter-rotating the holder comprise second and third arms which are engaged to form a parallelogram linkage between the shaft and the holder. Specifically, the first or drive arm is secured to the shaft and pivotally connected to the holder about a second axis (the holder axis) parallel to the first axis, that of the shaft itself. The second arm or crank, is secured to the holder at that second axis. The third arm is pivotally secured to the second arm at a third axis spaced apart from the second axis and is supported for rotation about a fourth axis which is spaced in angle and distance from the first axis in a like manner as the third axis is spaced from the second axis, whereby the four axes define a parallelogram in a reference plane drawn perpendicular to those axes. With this structure, the first arm drives the axis of the holder in a generally circular path. The second and third arms produce a counter rotation of the holder itself about the holder axis so that the holder maintains a fixed orientation in space despite its travel about the generally circular path. This linkage and drive system is thus effective to maintain a constant orientation of the workpiece holder as the holder traverses the beam.

In an other aspect, the invention features a system for driving the above-mentioned drive shaft which suitably varies the rate of rotation of that shaft to produce a substantially constant linear velocity of the holder as it traverses the treatment zone. Preferably, this is accomplished by an endless belt drive, the speed of the belt at its driving point for the shaft being suitably varied by a driven take-up, pay-out device interposed between the constant speed belt drive and the driven shaft. Preferably that drive system comprises a sprocket secured to the shaft and another sprocket driven by a motor with a belt trained about those sprockets. Another sprocket is provided and engaged with the belt between the first two sprockets. A cam member rotates with the intermediate sprocket and is in contact with a rotary cam follower supported on a fixed axis for rotation thereabout. The sprocket-and-cam member unit is movably mounted and biased in a direction away from the shaft. As the cam member rides on the rotary cam follower, therefore, the attached sprocket will be moved toward and away from the shaft thereby taking up and paying out segments of the belt at rates which differ from the rate of belt travel imparted by the motor driven sprocket. With a suitably cut cam member, the angular velocity of the workpiece holder may be increased in the peripheral portion of the treatment zone and/or decreased in the central portion so as to provide a substantially constant linear velocity of the holder across the treatment zone.

It is also preferred, in order to achieve the desired uniformity of ion implantation, that the workpiece holder be reciprocated. In a direction parallel to the axis of the shaft at the same time it is travelling in the generally circular path with constant angle with respect to the treatment beam. This reciprocating translation is preferably accomplished by mounting the entire shaft drive system (discussed above) on a frame which is supported on fixed rods, along which the system is reciprocated e.g. by a lead screw system driven by a motor which is periodically reversed.

It is also preferred that the reciprocating motion be adjusted with changes in the ion beam intensity in order to improve the uniformity of treatment of the workpieces. To this end, the beam intensity is monitored and means are provided to produce a signal proportional to the intensity of the beam at any given time and to proportionally adjust the speed of the second motor.

Other objects, features, and advantages of the invention will appear from the following description of a particular preferred embodiment taken together with the accompanying drawings in which.

Figure 1:
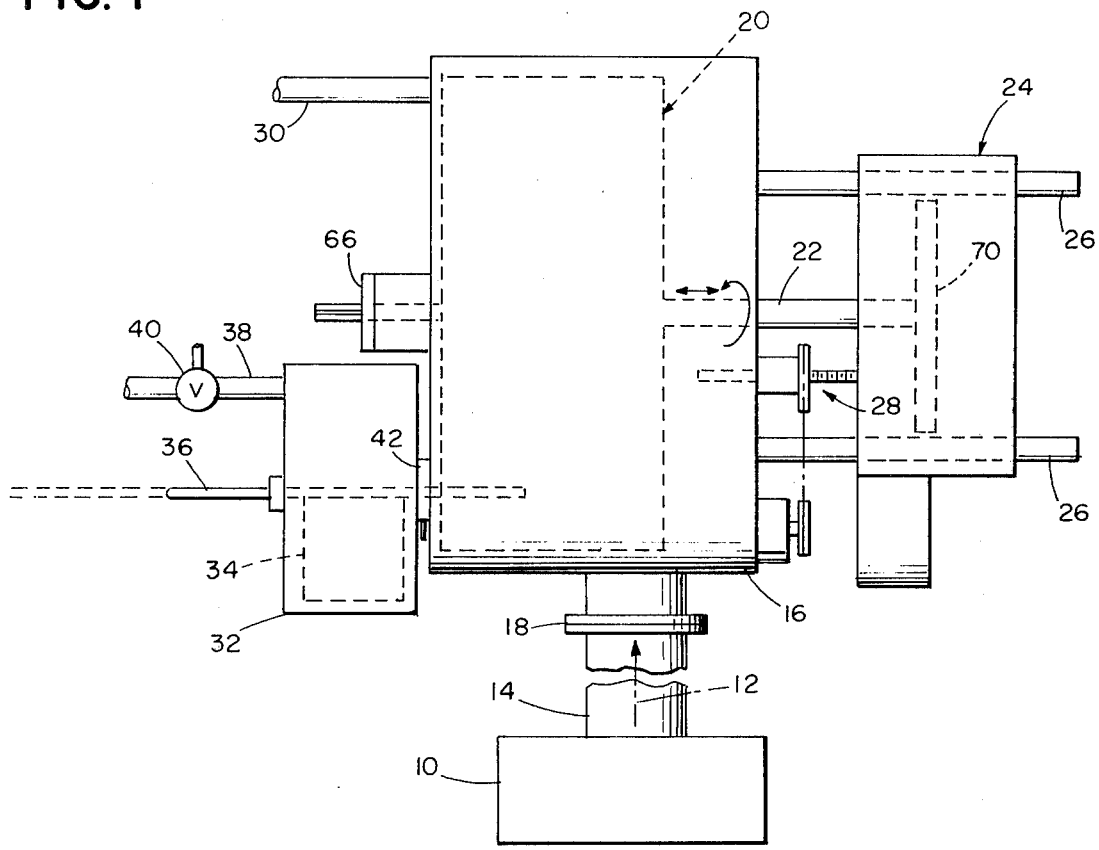
FIG. 1 is a schematic plan view of a machine for the ion implantation of semiconductor wafers, the machine incorporating features of the present invention.

Referring to FIG. 1, an ion beam generation system 10 produces an ion beam (indicated by arrow 12) which travels through an evacuated conduit 14 to an evacuated chamber 16. The conduit 14 is electrically insulated from the chamber 16 by insulating ring 18. The chamber 16 contains a mechanism, indicated generally at 20, for supporting wafer-form substrates to be exposed to the beam. The mechanism 20 is secured to a shaft 22 which is driven by a drive unit 24 located outside of the chamber 16. The unit 24 is itself supported for movement on rods 26 which are fixed to a wall of chamber 16. A second drive unit 28 outside of the chamber is provided for driving the entirety of unit 24 (along with mechanism 20 and shaft 22 with the chamber) in a direction parallel to shaft 22. Thus, as the arrows in FIG. 1 indicate, the shaft 22 may be both rotated about its axis and driven along its axis. A conduit 30 connects the chamber 16 (as well as the conduit 14) to a vacuum pump (not shown). A vacuum lock 32 is provided at the side of chamber 16 opposite the drive mechanism 24 and includes a wafer carriage 34, and wafer interchange mechanism 36, and a vacuum conduit 38 including a valve 40. A valve 42 is provided between the vacuum lock 32 and the chamber 16.

Figure 2:
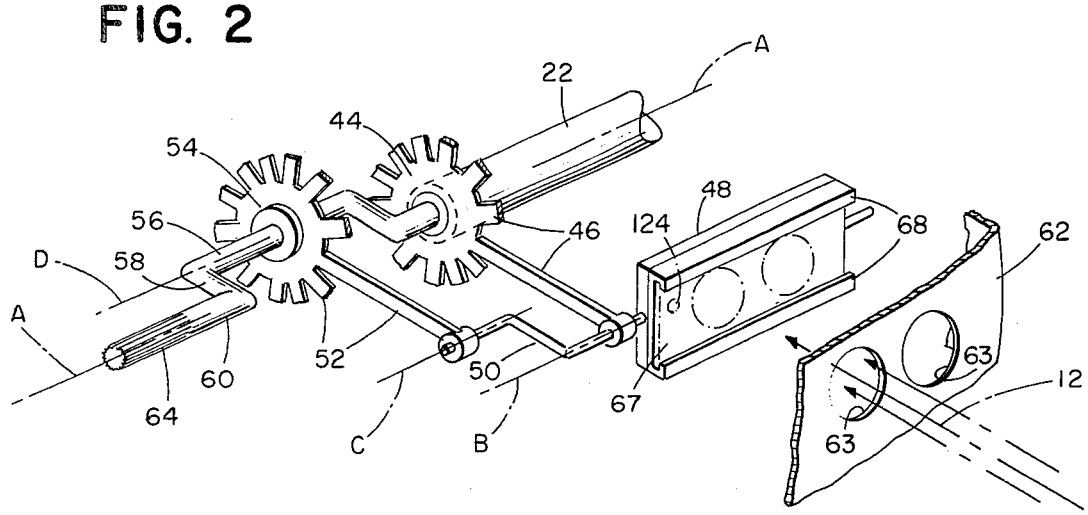
FIG. 2 is a fragmentary perspective view of a portion of the wafer transporting system of the machine of FIG. 1.
Figure 3:
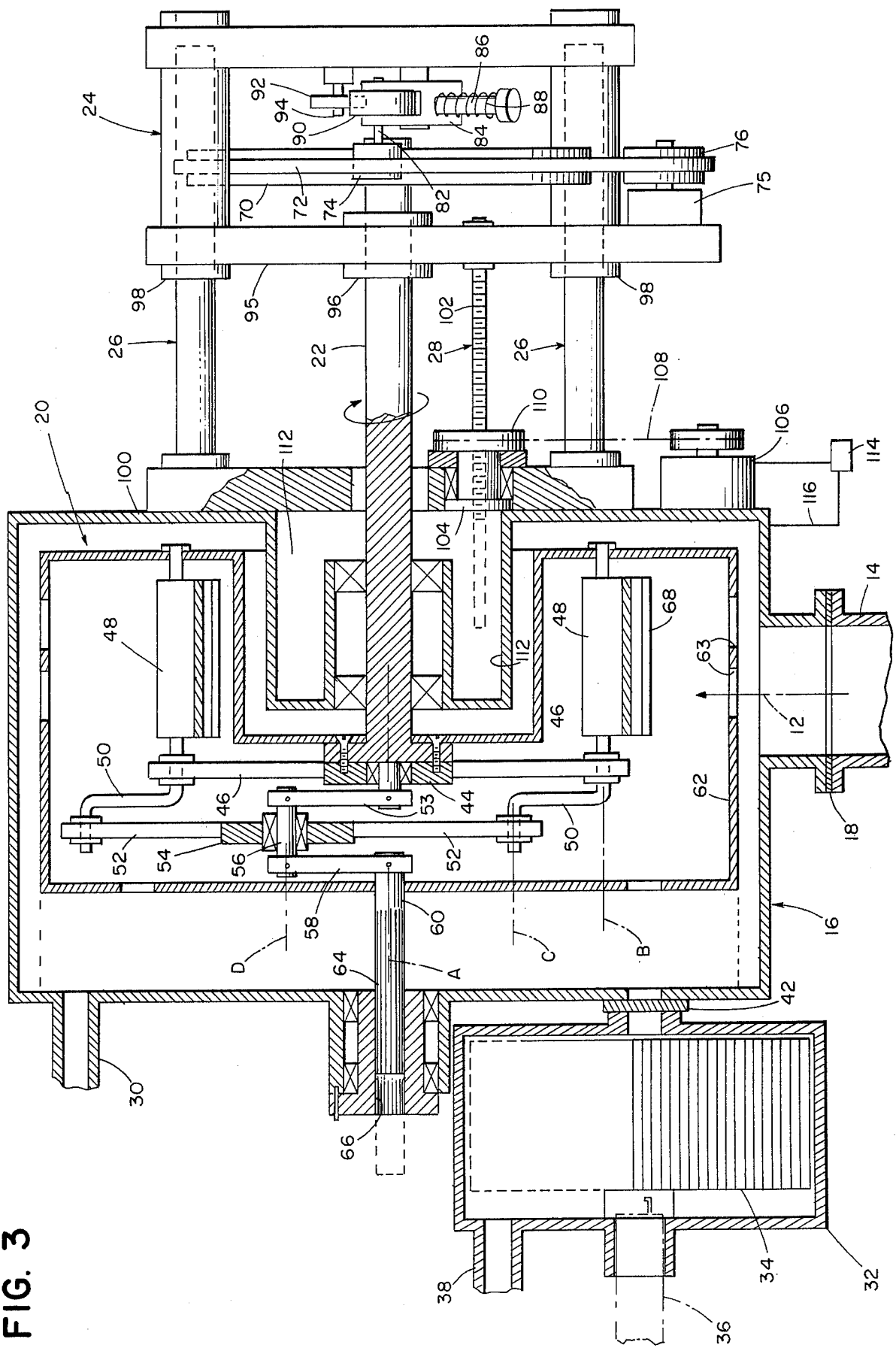
FIG. 3 is a view similar to that of FIG. 1 with portions of the machine broken away.
Figure 7:
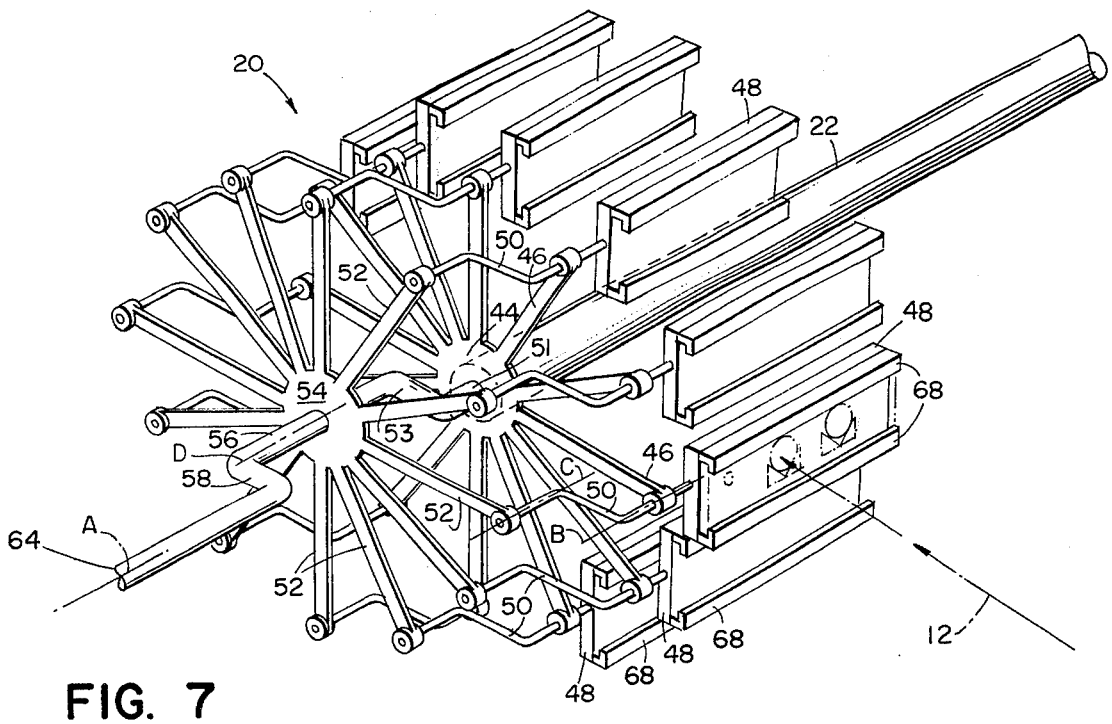
FIG. 7 is a view similar to that of FIG. 2.

FIGS 2, 3, and 7 illustrate the operation of the mechanism 20 in transporting a plurality of workpieces through the beam 12 for successive exposures to the beam. (In one preferred system, a pair of semiconductor wafers is mounted in a frame which facilitates handling of the delicate wafers. With this arrangement, the "workpiece" may be viewed as the frame plus wafers.). A member 44 is secured to the shaft 22 for rotation therewith and includes a plurality of integral arms 46 each of which is pivotally secured to a workpiece holder 48 at axis B which is parallel to the axis A of the shaft 22 (see also FIG. 4). A single set of arms 46 and holders 48 are illustrated in the fragmentary illustration of FIG. 2 and, by extrapolation, it will be seen that thirteen such pairs are symmetrically distributed around the shaft 22.

A second arm 50 is rigidly secured to each holder 48 at axis B forming a crank for the holder and a third arm 52 is pivotally secured to each second arm 50 at a third axis C. As with the arms 46, it is preferred that the arms 52 be formed as integral extensions of a single member 54 which is itself pivotally supported for rotation about a fourth axis D. A rod 56, which is pivotally secured to the member 54, is coaxial with axis D and is supported for rotation on an arm 58 which projects radially from rod 60. The rod 60 is coaxial with axis A and shaft 22. An enclosure 62 surrounds the holders 48 and linkage just described and rotates with shaft 22.

Openings 63 are provided in the enclosure 62 and are aligned with each substrate supported on each holder 48, thereby exposing the wafers to the beam 12 as the individual holders 48 traverse the beam. The enclosure serves as a shield to protect the various parts of mechanism 20 from exposure to the ion beam. The rod 60 and member 58 are held stationary by means of a keyed portion 64 of rod 60 which fits into mating notches in a hub 66 secured to a fixed wall of chamber 16. The workpieces 67 are supported by rails 68 on the surface of holder 48 which will face the beam 12 as the holder 48 passes through the zone of its closed path (i.e., the "treatment zone") in which the beam intersects that path.

Figure 4:
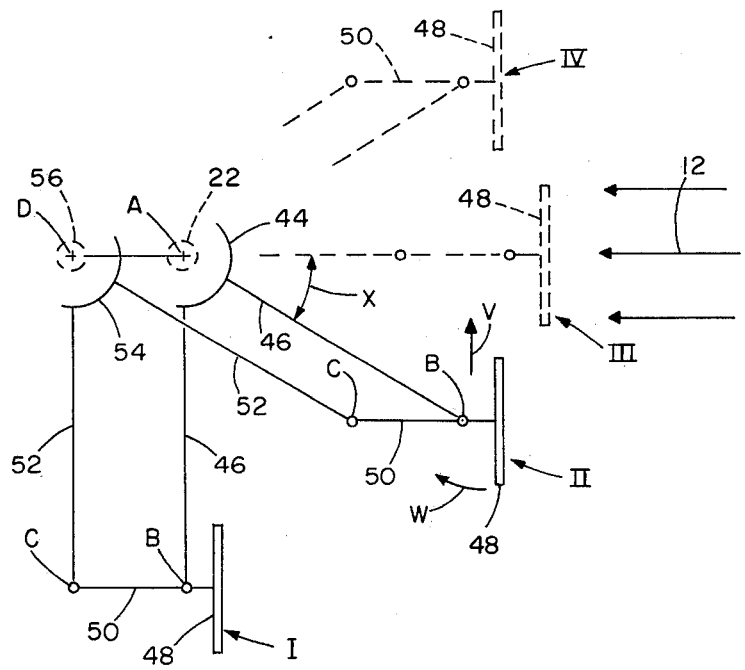
FIGS. 4 and 4A illustrate the operation of the mechanism shown in FIG. 2 for two different angles of inclination of the wafers to the ion beam.

The operation of the shaft 22, holders 48 and the linkage there-between to transport the substrates through the beam with a fixed orientation with respect to the beam can be best described with reference to FIG. 4. As is clear from FIG. 4, the axes A, B, C, and D form a parallelogram in every angular position of the holder 48 (except the 0° and 180° positions with respect to the beam 12, in which positions the parallelogram collapses to a single line). In one preferred embodiment the drive arm 46 and the idler arm 52 are each approximately 8½ inches long, the axes A and D are 1 and ½ inches apart, as are the axes B and C. In FIG. 4 the holder 48 is shown in four positions in its closed path about the axis A, these positions being numbered I, II, III, and IV. The motion is in a counter-clockwise direction above the axis A and thus the holder 48 enters the treatment zone defined by beam 12 from below, sweeps across it, and then leaves the beam upwardly. As is evident from these successive positions of the holder 48, the crank arm 50 and idler arm 52 is to produce a counter-rotation of the holder 48 which nullifies the effect of its rotation about axis A in terms of the orientation of the holder with respect to the beam. Thus, despite the changes in the angle, X, which the drive arm 46 makes with the axis of beam 12, the holder remains in a orientation which is perpendicular to the axis of the beam.

Figure 4A:
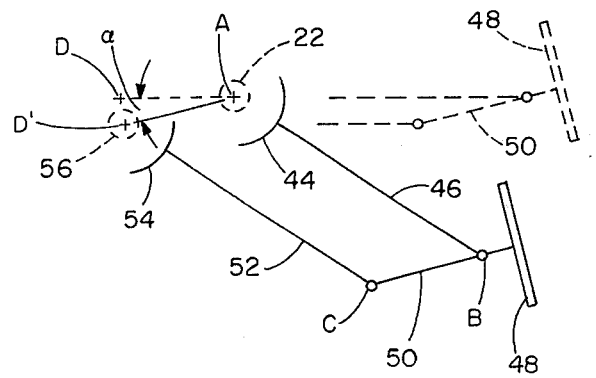

In various circumstances it may be desirable to have the holder 48 oriented other than perpendicular to the beam 12. A particular example of this is in the production of semiconductors by ion implantation wherein the substrates have been prepared such that the surface of the substrate which faces the beam is aligned with a "major channeling direction" of the substrate's crystalline lattice. In this situation, the holder 48 may be maintained at a tilted, but constant, orientation with respect to the beam 12 by the simple expedient of rotating the position of axis D with respect to axis A, the rotated position being indicated at D' in FIG. 4A. As is clear from elementary geometry, a tilt of equal magnitude is obtained in the orientation of the holder 48.

Referring to FIG. 3 this change in the position fixed axis A can be achieved by providing a outer surface to hub 66, the hub defining axis D, which is eccentric to the hub inner mounting surface which engages shaft 56. Thus by adjusting the rotated position of the hub 66, the position of axis D in space can be varied.

Referring again to FIG. 4, it will be seen that the linear velocity, v, of the holder 48 as it travels in the direction across the beam 12 is given by the relationship $$v = rw \cos X$$

where $r$ is the radius from the center of rotation (i.e., effectively the length of drive arm 46), $w$ is the angular velocity about the axis A, and $X$ is the angle between the radius arm 46 and the axis of the beam 12. It is thus clear that with a constant angular velocity, $w$, a maximum linear velocity, $v$, occurs at the center of the holder 46 when the angle $X = 0°$. The effective linear velocity, $v$, decreases on either side of the beam 12 center line as long as the angular velocity, $w$, remains constant. According to the present invention, the angular velocity, $w$, is appropriately varied to produce a constant velocity, $v$, for each holder 48 as it passes through the beam 12. The basic technique for accomplishing this may be described with reference to FIG. 5.

Figure 5:
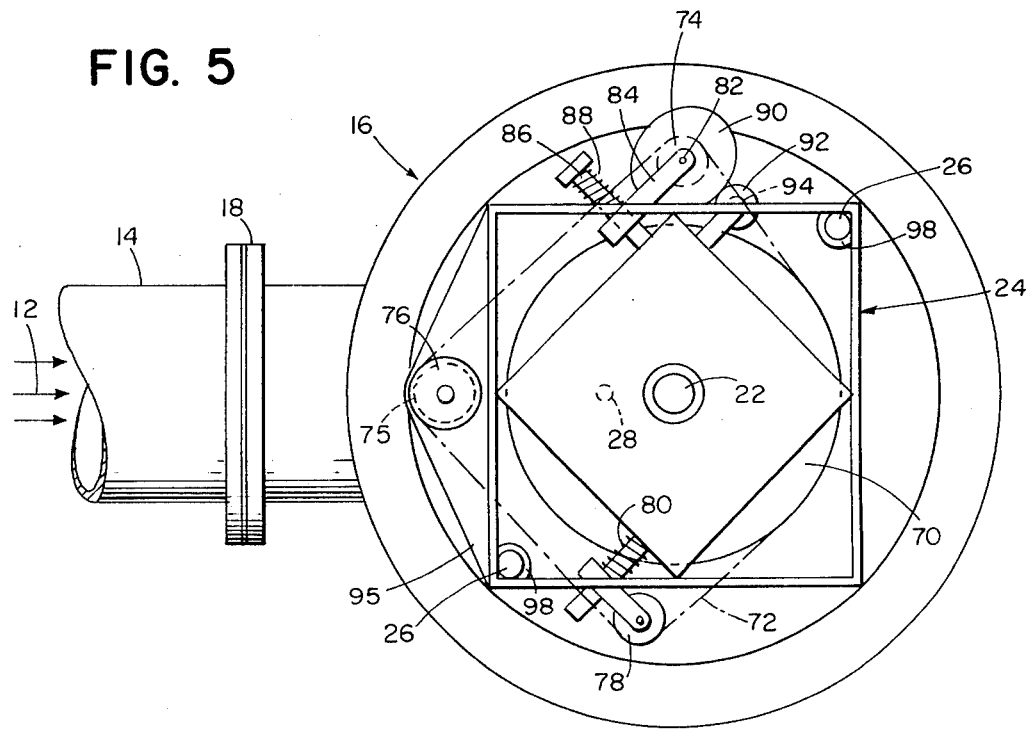
FIG. 5 is a view taken at 5—5 of FIG. 3 illustrating the drive system for the wafer support system illustrated in FIGS. 2 and 4.

Referring to FIG. 5, a sprocket 70 is secured for rotation with shaft 22 and an endless timing belt 72 is trained about the sprocket. Three other sprockets 74, 76, 78 are also provided and form a generally square array with the sprocket 70, resulting in a generally square path for the endless belt 72. The sprocket 76 is driven from a motor 72 for driving the belt 72 at a uniform rate. The sprocket 78 is an idler sprocket and is biased by spring 80 in a direction away from the shaft 22 and sprocket 70 so as to take up belt when a surplus is present. The sprocket 74, located between the drive sprocket 76 and sprocket 70 in the direction of travel of the belt 72, is mounted for rotation about a pivot 82 on a support 84. The support itself is mounted for sliding motion on a rod 86 and is biased as by spring 88 in a direction toward shaft 22 and sprocket 70. A cam member 90 is secured for rotation with the sprocket 74 and rides on a rotary cam follower 92 which is supported for rotation about a fixed axis 94. With an appropriately cut cam member 90, (positioned on its shaft in predetermined relation to the angle of the holders, to achieve constant $v$) it will be seen that the sprocket 74 and support 84 can be driven toward and away from the sprocket 70 thereby taking up and paying out some of belt 72 to the sprocket 70 at rates which differ from the velocity imparted to the belt by the drive sprocket 76. The angular velocity, $w$, of each holder 48 (see FIG. 2 and 4) may thus be increased in both the lower and upper peripheral portions of the beam 12 and decreased in the central portion of the beam 12 in order to compensate for the "cos X" effect noted above and to produce a constant linear transversal velocity, $v$, of the holder across the beam.

As best seen in FIG. 3, the entirety of the drive mechanism for shaft 22 is supported on a frame 95 and the shaft itself is supported in a thrust bearing 96 mounted on the frame. The frame is slidable in a direction parallel to the axis A of shaft 22 by means of slide bearings 98 which engage rods 26 secured to an end wall 100 of the chamber 16. A threaded rod 102 is also secured to the frame 96 and a nut, journalled as at 104 in a structural member integral with end wall 100, is engaged with the threads of rod 102. That nut is driven from a second motor 106 through a belt 108 and a pully 110 secured to the nut. The operation of the second motor 106, therefore, will cause the translation of the entire subunit comprising shaft 22, the workpiece holder and linkage system, and the shaft drive system to travel in a direction along the axis of the shaft 22. By periodic reversals of the motor 106 the entire mechanism 20 thus may be scanned laterally across the beam 12 at the same time that the individual holders 48 are passing upwardly through the beam with a constant linear velocity. This dual motion provides for uniform exposure of the substrates to the beam 12 and permits a wider effective area of each holder 48 to be employed during each loading of the mechanism 20 with workpieces, than would otherwise be possible. A recess 112 provided in the end wall 100 of the chamber 16 permits the required travel of the rod 102 to achieve this reciprocating motion.

With the provision of the insulator 18 in the beam conduit 14, chamber 16 and mechanism 20 are electrically insulated from the conduit 14 and the beam current can be monitored and a proportional electrical signal generated by an appropriate unit 114 connected to the insulated items by a lead 116. The unit 114 is conventionally constructed to vary the input voltage to the motor 106 proportionally with the intensity of the beam 12. Thus, unavoidable changes in beam intensity cause concurrent changes in the speed with which the workpieces are passed across the beam 12 and a more uniform total dose results. The rotational motion is maintained, however, in order to achieve continued uniformity of beam distribution over the workpieces and to avoid "hot spots" upon beam resumption after a beam failure.

Figure 6:
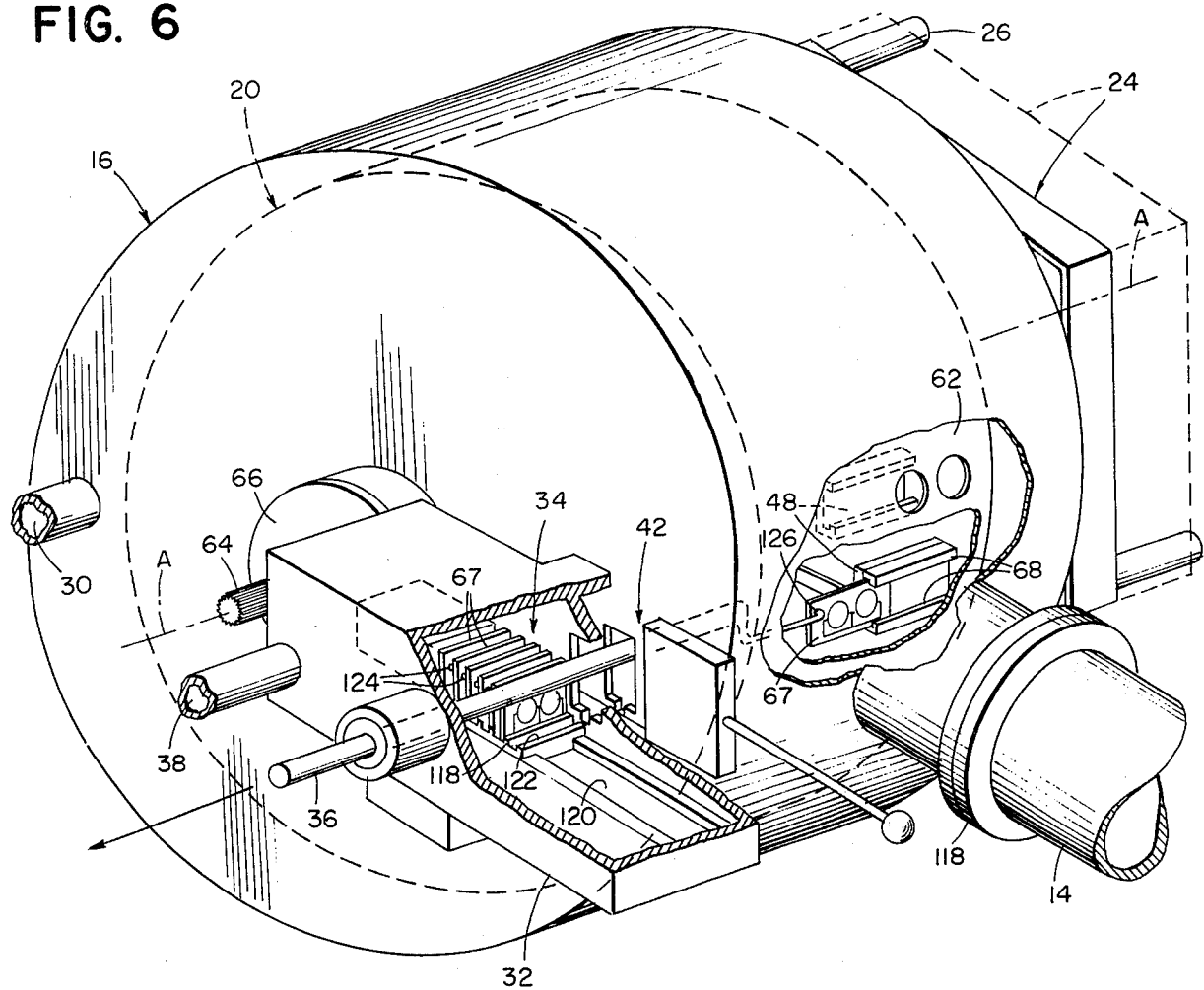
FIG. 6 is a partially broken away perspective view, of a portion of the apparatus of FIG. 1.

The loading and unloading of substrates from the various holders 48 is accomplished, as shown in FIG. 6, through the vacuum lock 32. Referring to FIGS. 1 and 6, during the doping operation the mechanism 20 will both rotate and reciprocate through the beam for a predetermined number of times until the workpieces have received their calculated desired doping level. Following this process, the mechanism 20 can be halted at the extreme left wall of chamber 16 directly adjacent the vacuum lock 32. The lock 32 will have been prepumped via conduit 38 to a suitable vacuum pressure after a workpiece receptacle 118 container fresh workpieces 67 has been placed on track 120 with the lock. Then the valve 42 opened interconnecting the interior of the chamber 16 and the vacuum lock 32. Using the drive system 24, the mechanism 20 is then indexed to bring a holder 48 directly opposite the valve 42. The workpiece receptacle 118 is then indexed (by an conventional mechanism, not shown) to bring first an empty substrate slot 122 adjacent the valve 42. With the vacant slot adjacent the slot 42 the device 36 is employed to transfer the treated workpiece 67 from the aligned holder 48 to the vacant slot 122 in the receptacle. For this purpose, each workpiece frame may have an opening 124 for receiving a hooked end portion 126 of the device 36. The receptacle is then indexed one step and an untreated workpiece is pushed, using again the unit 36, into position in the now vacant holder 48. After the indexing of the mechanism 20 to bring the next holder 48 into alignment with the valve 42, the process may be repeated. Upon completion of the interchange, the valve 42 is closed and the exposure of the fresh workpieces to the beam begun. The valve 40 is employed to vent the vacuum lock 32 to atmospheric pressure for the removal of the treated wafers now contained in receptacle 34 and for the installation of another receptacle 34 containing untreated wafters to be available for the next interchange.

While a particular preferred embodiment of the invention has been illustrated in the accompanying drawings and described in detail herein, other embodiments are within the scope of the invention and the following claims.

What is claimed is:

1. An apparatus for distributing a beam substantially uniformly over a workpiece comprising a workpiece holder exposed to a treatment zone having said beam, first means for rotating said holder in a generally circular path about a first axis which is generally perpendicular to the axis of said beam, second means for counter-rotating said holder about a second axis parallel to said first axis at a rate dependent upon the rate of rotation of said holder about said first axis to provide, in cooperation with said first means, a constant angle of orientation of said holder relative to said beam, and third means for producing relative translational motion between said workpiece and said beam in a direction parallel to said first axis.

2. An apparatus as claimed in claim 1 adapted for the implantation of ions in a substrate, said holder being housed in a vacuum chamber, said beam being an ion beam and said workpiece comprising a substrate.

3. An apparatus as claimed in claim 2 including an ion shield enclosing said circular path and having an aperture aligned with said workpiece for the direct exposure of said workpiece to said beam.

4. An apparatus as claimed in claim 1 further including fourth means for varying the rotational speed of said holder about said first axis as said holder traverses said beam to provide a substantially constant linear velocity of said holder across said beam.

5. An apparatus as claimed in claim 4 wherein the axis of said beam intersects said first axis, said fourth means decrementing said rotational speed of said holder in said beam up to the centerline of said beam and incrementing said rotational speed of said holder in said beam after said centerline has been passed.

6. An apparatus as claimed in claim 5 wherein said fourth means comprises an endless belt driving said first means, a motor driving said belt and means along said belt intermediate said motor and first means for altering the rate at which said belt is fed to said first means in accordance with the position of said holder in its traverse of the beam thereby to vary the speed at which said belt drives said first means.

7. An apparatus as claimed in claim 6 wherein said means along said belt comprise a circular member mounted for rotation on a support, a cam member mounted for rotation with said second circular member, and a cam follower mounted for rotation about an axis fixed with respect to said first axis, said support mounted for sliding motion in one direction and biased in the opposite direction whereby said circular member on said support can take up and pay out traveling belt trained thereabout in accordance with the shape of said cam.

8. An apparatus as claimed in claim 7 wherein said circular member is a first sprocket, said belt is a timing belt, said first means further comprising a second sprocket engaging said belt and driven thereby and a third sprocket engaging said belt beyond said second sprocket, said third sprocket being movable across the belt path and being biased to take up belt when belt is paid out by said first sprocket.

9. An apparatus as claimed in claim 1 wherein said first means comprise a shaft disposed along said first axis means for rotating said shaft and a first arm secured to said shaft for rotation therewith and pivotally attached to said holder at a second axis, said second means comprising a second arm secured to said holder at said second axis to form a crank and a third arm disposed parallel to said first arm and pivotally attached to said second arm at a third axis spaced apart a predetermined distance from said second axis and supported for rotation about a fourth axis which is spaced apart said predetermined distance from said first axis, said axes being parallel and defining a parallelogram in a plane perpendicular thereto.

10. An apparatus as claimed in claim 9 for transporting a plurality of workpieces along said path simultaneously, the apparatus including a like plurality of holders, first arms, second arms, and third arms.

11. An apparatus as claimed in claim 1 for use with a beam of charged particles, the apparatus further including means for automatically adjusting the speed of said relative motion with changes in the intensity of said beam.

12. An apparatus as claimed in claim 11 wherein said relative motion is produced by a motor which drives said holder and said first means along said first axis, said last mentioned means comprising a collector disposed to intercept a portion of the charged particles in said beam and to deliver a signal proportional to the intensity of the intercepted charged particles at any given time and a motor control unit connected to receive the output of said collector means to generate a control signal, said control signal being applied to means which vary the motor speed.

13. An apparatus as claimed in claim 9 comprising adjustment means for adjusting the orientation of said parallelogram, thereby changing the angle of orientation of said holder relative to said beam.

14. An apparatus as claimed in claim 13 wherein said adjustment comprise means for changing the location of said fourth axis on a reference circle centered on said first axis and having a radius equal to said predetermined distance, whereby the angle said holder makes with the axis of said beam may be changed.

15. An apparatus as claimed in claim 14 wherein said means for changing comprise a second shaft disposed along said fourth axis and secured to said third arm, a rod supported for rotation and disposed along said first axis, and a cross member secured to both said second shaft and said rod, whereby rotation of said rod moves said second shaft along a circular path centered on said first axis.

16. The apparatus of claim 1 including means to set the angle of orientation of said holder relative to said beam.

17. An apparatus as claimed in claim 1 for use with a beam of charged particles, said first means rotating said holder uninterruptedly, the apparatus first further including means for automatically adjusting the speed of said relative motion with changes in the intensity of said beam.

18. In an ion implantation apparatus including a vacuum chamber and an ion source, said apparatus adapted to substantially uniformly implant ions from an ion beam from said source over a substrate, a scanning apparatus comprising a substrate holder, first means for rotating said holder in a generally circular path about a first axis which is generally perpendicular to the axis of said beam, second means for counter-rotating said holder about a second axis parallel to the first axis at a rate dependent upon the rate of rotation of said holder about said first axis to provide, in cooperation with said first means, a constant orientation of said holder relative to said beam, third means for producing relative translational motion between said workpiece and said beam in a direction parallel to said first axis, and fourth means for varying the rotational speed of said holder about said first axis as said holder traverses said beam to provide a substantially constant linear velocity of said holder across said beam.

19. Apparatus for exposing a workpiece to a treatment comprising a workpiece holder and a holder support system for moving said holder through a treatment zone while maintaining a given orientation, said support system comprising a rotatable shaft having a first axis, means for rotating said shaft, and a linkage interconnecting said shaft and said holder, said linkage comprising a first arm secured to said shaft for rotation therewith and pivotally attached to said holder at a second axis, a second arm secured to said holder at said second axis forming a crank, a third arm disposed parallel to said first arm and pivotally attached to said second arm at a third axis spaced apart a predetermined distance from said second axis and supported for rotation about a fourth axis which is spaced apart said predetermined distance from said first axis, said axes being parallel and defining a parallelogram in a plane perpendicular thereto, said apparatus being constructed for transporting a plurality of workpieces simultaneously for exposure to said treatment, the apparatus including a like plurality of holders, first arms, second arms, and third arms, said plurality of first arms being integral with each other and said plurality of third arms being integral with each other.

20. An apparatus as claimed in claim 19 further including reciprocating means for reciprocating said holder and linkage in a direction parallel to said axes, whereby said holder can traverse said treatment zone in two orthogonal directions.

21. An apparatus as claimed in claim 20 adapted for the implantation of ions in a substrate, said beam being an ion beam and said workpiece comprising a substrate wherein said reciprocating means comprise a motor which drives said holder and said shaft along said first axis, a collector disposed to intercept a portion of the charged particles in said beam and to deliver a signal proportional to the intensity of the intercepted charged particles at any given time, and a motor control unit connected to receive the output of said collector means to generate a control signal, said control signal being applied to means which vary the motor speed.

* * * * *